United States Patent
Song et al.

(10) Patent No.: US 9,184,167 B2
(45) Date of Patent: Nov. 10, 2015

(54) MEMORY CELL SUPPORT LATTICE

(75) Inventors: Zhimin Song, Boise, ID (US); Che-Chi Lee, Banciao (TW); Brett Busch, Boise, ID (US)

(73) Assignee: Micron Technology, Inc., Boise, ID (US)

(*) Notice: Subject to any disclaimer, the term of this patent is extended or adjusted under 35 U.S.C. 154(b) by 94 days.

(21) Appl. No.: 13/590,791

(22) Filed: Aug. 21, 2012

(65) Prior Publication Data

US 2014/0054745 A1     Feb. 27, 2014

(51) Int. Cl.
    *H01L 27/108*     (2006.01)
    *H01L 21/8242*     (2006.01)
    *H01L 49/02*     (2006.01)

(52) U.S. Cl.
    CPC .... *H01L 27/10852* (2013.01); *H01L 27/10814* (2013.01); *H01L 27/10817* (2013.01); *H01L 28/91* (2013.01)

(58) Field of Classification Search
    CPC .................. H01L 27/10582; H01L 27/10814; H01L 27/10852; H01L 27/10817
    USPC .......................... 257/532, 306; 438/397; 216/6
    See application file for complete search history.

(56) References Cited

U.S. PATENT DOCUMENTS

| | | | |
|---|---|---|---|
| 7,459,380 B2 | 12/2008 | Bour et al. | |
| 7,560,364 B2 | 7/2009 | Bour et al. | |
| 8,035,153 B2 | 10/2011 | Fang et al. | |
| 2006/0134854 A1* | 6/2006 | Park et al. | 438/239 |
| 2008/0203482 A1 | 8/2008 | Han et al. | |
| 2009/0206448 A1* | 8/2009 | Cho et al. | 257/532 |
| 2010/0229265 A1 | 9/2010 | Jin et al. | |
| 2012/0064680 A1* | 3/2012 | Oh et al. | 438/239 |
| 2012/0161283 A1* | 6/2012 | Kadoya | 257/532 |
| 2012/0199944 A1* | 8/2012 | Huang et al. | 257/532 |
| 2012/0225554 A1* | 9/2012 | Yoon et al. | 438/675 |
| 2012/0235279 A1* | 9/2012 | Seo | 257/532 |
| 2013/0161786 A1* | 6/2013 | Huang et al. | 257/532 |
| 2013/0164902 A1* | 6/2013 | Greeley et al. | 438/381 |
| 2013/0178057 A1* | 7/2013 | Huisinga et al. | 438/633 |

* cited by examiner

*Primary Examiner* — Matthew Reames
*Assistant Examiner* — John Bodnar
(74) *Attorney, Agent, or Firm* — Brooks, Cameron & Huebsch, PLLC

(57) ABSTRACT

Memory cell support lattices and methods of forming the same are described herein. As an example, a method of forming a memory cell support lattice includes forming a mask on a number of capacitor elements in an array, such that a space between vertically and horizontally adjacent capacitor elements is fully covered and a space between diagonally adjacent capacitor elements is partially covered and forming a support lattice in a support material by etching the support material to remove portions of the support material below the openings in the mask.

18 Claims, 5 Drawing Sheets

MEMORY CELL SUPPORT LATTICE

TECHNICAL FIELD

The present disclosure relates generally to memory cells and methods, and more particularly to memory cells having a support lattice.

BACKGROUND

Many electronic devices and systems include integrated circuits for the storage of data during the operation of the devices. For example, electronic devices such as computers, printing devices, scanning devices, personal digital assistants, calculators, computer work stations, audio and/or video devices, communications devices such as cellular telephones, and routers for packet switched networks may include memory in the form of integrated circuits for retaining data as part of their operation. Advantages of using integrated circuit memory compared to other forms of memory include space conservation and miniaturization, conserving limited battery resources, decreasing access time to data stored in the memory, and cutting the costs of assembling the electronic devices.

Dynamic Random Access Memory (DRAM) is an example of integrated circuit memory. DRAM typically comprises an array of semiconductor capacitor cells, each of which may hold an amount of electric charge that represents the logical value of a stored bit. The cells in the array are typically arranged in rows and columns. Each cell is situated at the intersection of a row and a column. Each cell in the DRAM array may be accessed by simultaneously addressing the intersecting row and column.

In operation, internal amplifiers in the DRAM sense the amounts of electric charges stored on the capacitors. Based on the sensed electric charges, the outputs of the sense amplifiers represent the logical values of the bits that are stored in the DRAM array. In this manner, the data stored in the array may be extracted from the DRAM integrated circuit for use by other integrated circuits in the electronic device. In addition, other internal circuitry on the DRAM refreshes the charge on those cells that the sense amplifiers have determined to already hold an electric charge. In this manner, the DRAM compensates for leakages of electric charge from the semiconductor capacitor cells, such as leakage into the substrate of the DRAM integrated circuit. Such reading, writing, and maintaining of charge on the cells are substantial internal operations of the DRAM.

The capacitors in DRAM cells can be containers and/or studs that are coupled to a cell contact. The containers and/or studs can move laterally, especially at the end of the container and/or stud that is not coupled to the cell contact. Containers and/or studs that move laterally and contact adjacent containers and/or studs can damage an array of DRAM cells and cause those DRAM cells to be inoperable.

DETAILED DESCRIPTION

Figure 1A:
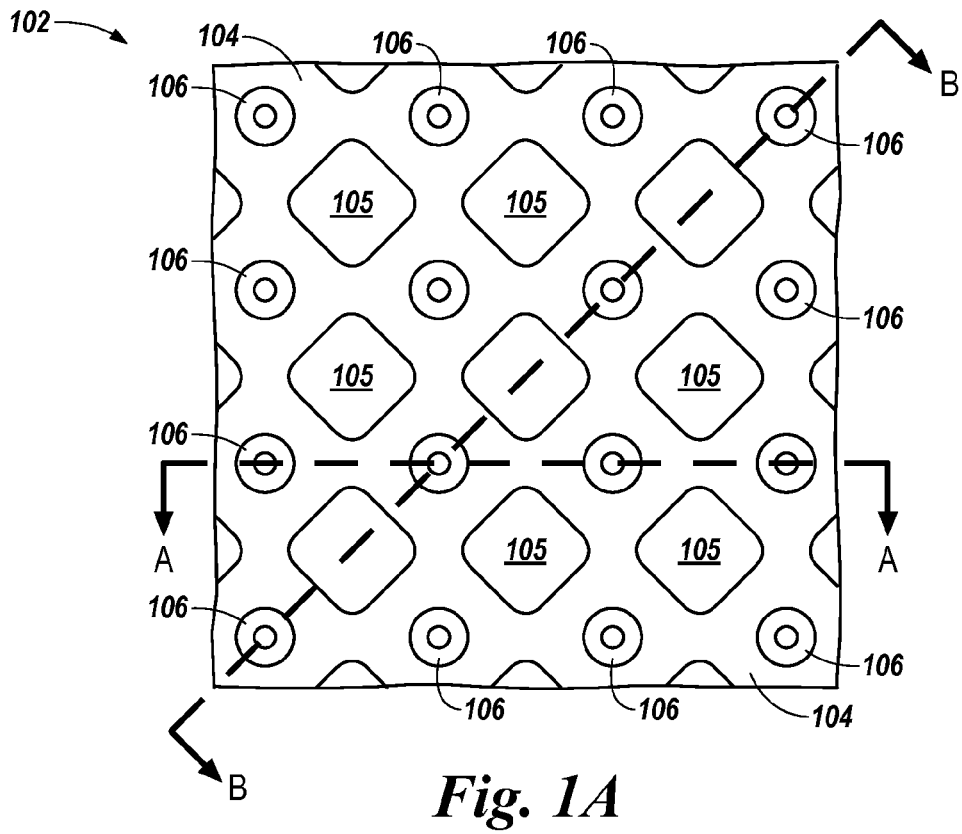
FIGS. 1A-1C illustrate a portion of an array of memory cells having a support lattice in accordance a number of embodiments of the present disclosure.

Memory cell support lattices and methods of forming the same are described herein. As an example, a method of forming a memory cell support lattice includes forming a mask on a number of capacitor elements in an array, such that a space between vertically and horizontally adjacent capacitor elements is fully covered and a space between diagonally adjacent capacitor elements is partially covered and forming a support lattice in a support material by etching the support material to remove portions of the support material below the openings in the mask.

Embodiments of the present disclosure can provide memory cell support lattices that include self-aligned openings and provide support to limit lateral movement of the capacitor elements in a memory cell array. The support lattice can limit lateral movement of the capacitor elements while providing openings to access portions of the memory cells below the support lattice.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M" and "N" indicate that one or more of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 112 may reference element "12" in FIG. 1, and a similar element may be referenced as 212 in FIG. 2. Also, as used herein, "a number of" a particular element and/or feature can refer to one or more of such elements and/or features.

Figure 1B:
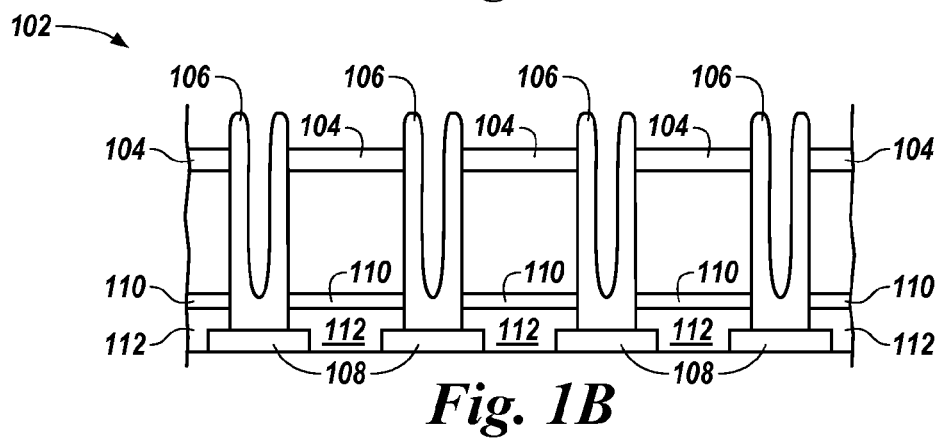
Figure 1C:
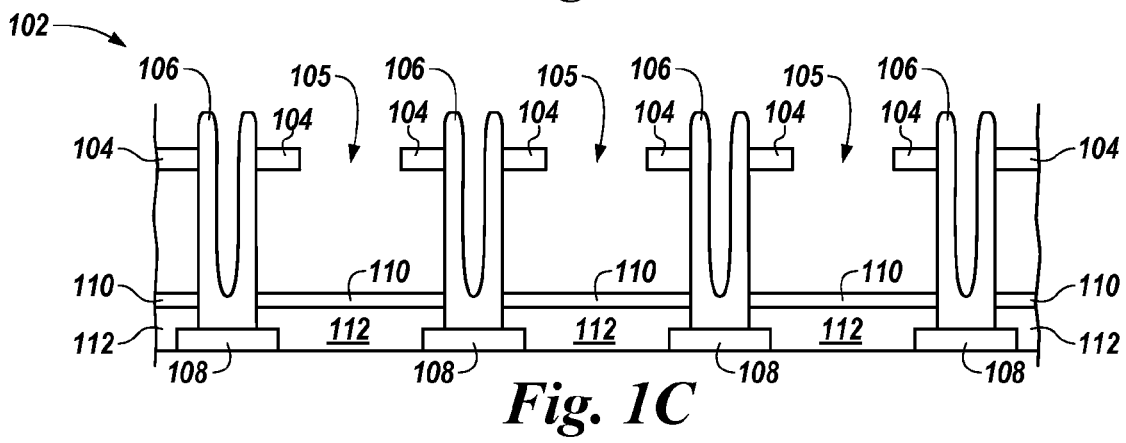

FIGS. 1A-1C illustrate a portion of an array of memory cells having a support lattice in accordance a number of embodiments of the present disclosure. FIG. 1A illustrate a top view of the array of memory cells 102 having a support lattice 104. In FIG. 1A, a support lattice 104 surrounds a number of capacitor elements 106 of the array of memory cells. The support lattice 104 can provide support for the capacitor elements 106 to limit lateral movement of the capacitor elements 106. The support lattice 104 can prevent the capacitor elements 106 from moving laterally and touching one another. The support lattice 104 can include a number of openings 105. The openings 105 can provide access to portions of the array of memory cells 102 below the support lattice 104 during process steps to form the array of memory cells. For example, the openings 105 can be used to allow an etch material to access and remove a dielectric material below the support lattice 104. The openings 105 can also, for example, be used to allow a dielectric material to be formed on the capacitor elements below the support lattice 104.

FIG. 1B illustrates a cross-sectional view of the array of memory cells 102 along the A-A cut line. In FIG. 1B, the array of memory cells 102 include a number of cell contacts 108 formed in a dielectric material 112. Each of the capacitor elements 106 can be coupled to a cell contact 108, which can be coupled to an access device (not illustrated), such as a transistor, for example. In one or more embodiments, a dielectric material 110 can be formed on the dielectric material 112. The dielectric material 110 can be used as an etch stop layer during various process steps where materials are removed via an etch process.

In FIG. 1B, the support lattice 104 is continuous between the capacitor elements 106. In a number of embodiments, the support lattice is continuous horizontally and vertically along the rows and columns of capacitor elements 106 in the array of memory cells 106. For instance, the support lattice is continuous between horizontally adjacent capacitor elements and vertically adjacent capacitor elements.

FIG. 1C illustrates a cross-sectional view of the array of memory cells 102 along the B-B cut line. In FIG. 1C, the support lattice 104 is noncontiguous between the capacitor elements 106. In a number of embodiments, the support lattice is noncontiguous diagonally between capacitor elements 106 in the array of memory cells 106. The non-contiguous portion of the support lattice 104 includes openings 105, which allow access to portions of the array of memory cells below the support lattice. The support lattice 104 includes openings 105 that are self-aligned diagonally between the capacitor elements 106.

Figure 2A:
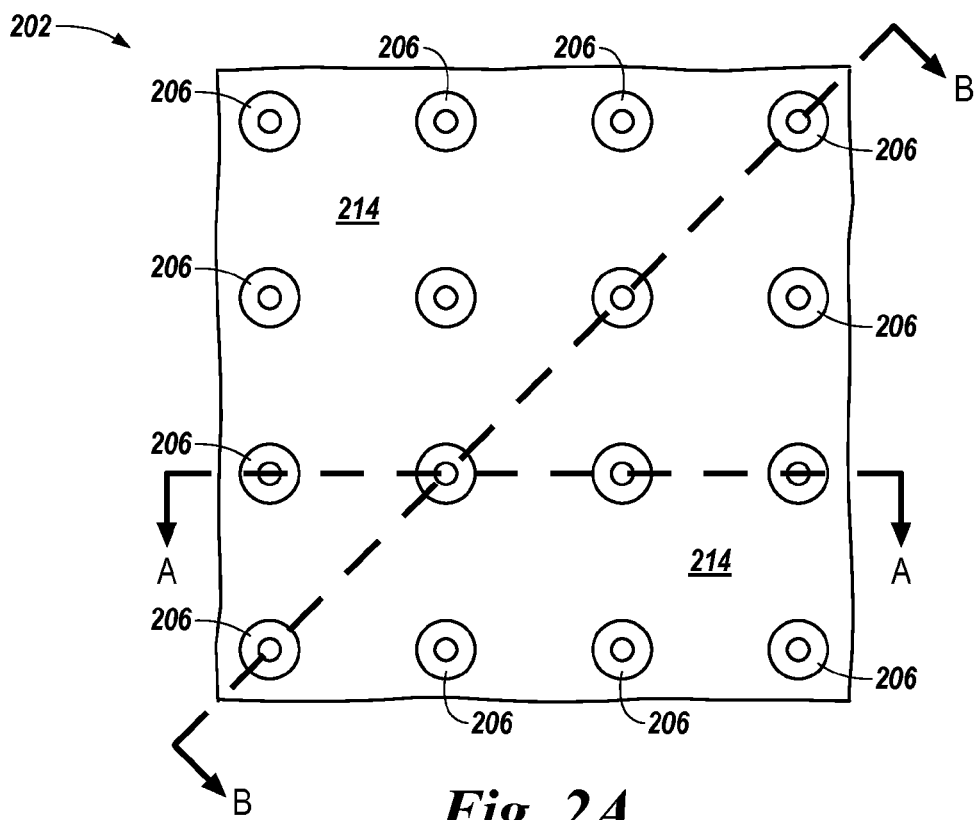
FIGS. 2A-2C illustrate various process stages associated with forming a support lattice in accordance with a number of embodiments of the present disclosure.
Figure 2B:
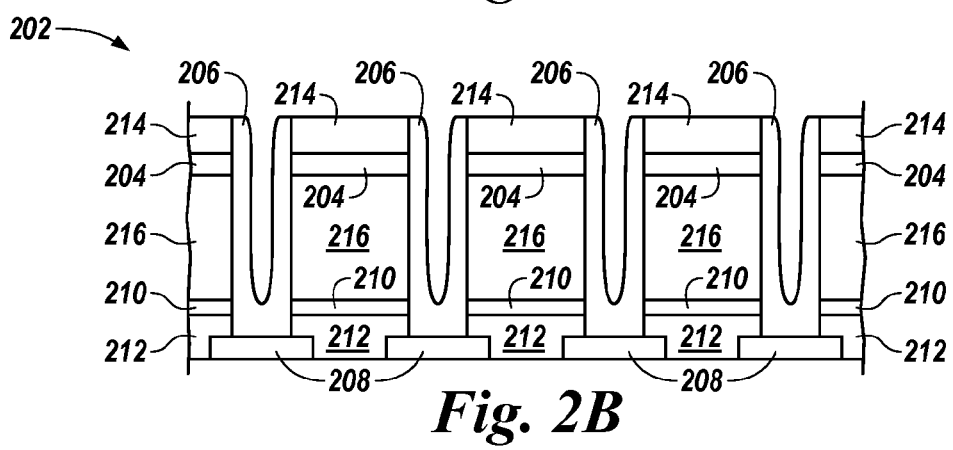
Figure 2C:
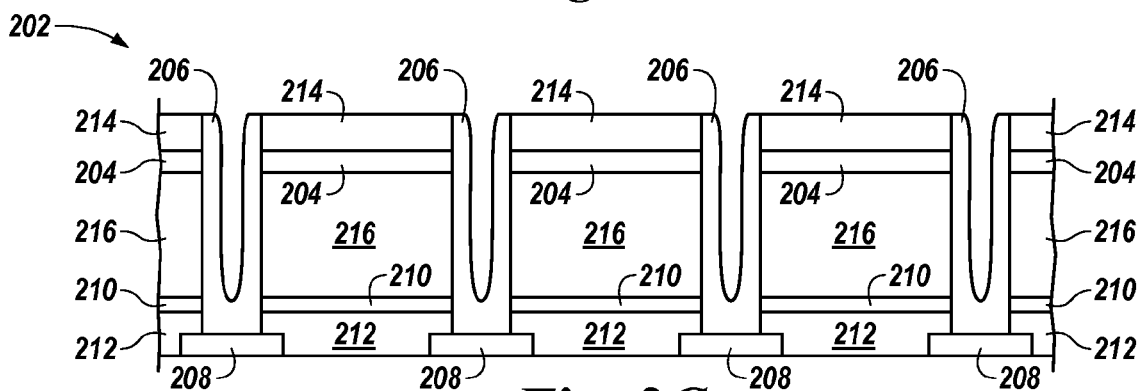

FIGS. 2A-2C illustrate various process stages associated with forming a support lattice in accordance with a number of embodiments of the present disclosure. FIG. 2A illustrates a top view of a portion of an array of memory cells in accordance with a number of embodiments of the present disclosure. FIG. 2B illustrates a cross-sectional view of a portion of an array of memory cells along the A-A cut line in accordance with a number of embodiments of the present disclosure. FIG. 2C illustrates a cross-sectional view of a portion of an array of memory cells along the B-B cut line in accordance with a number of embodiments of the present disclosure.

FIG. 2A illustrates a number of capacitor elements 206 formed in a material stack, where the top of the material stack includes a dielectric material 214. FIGS. 2B and 2C illustrate capacitor elements 206 formed in a material stack that includes a dielectric material 212, a dielectric material 208, a dielectric material 216, a support material 204, and a dielectric material 214.

In a number of embodiments, the capacitor elements 206 can be formed by forming a material stack. The material stack can include the dielectric material 212 formed on a substrate and the cells contacts 208, the dielectric material 210 formed on the dielectric material 212, the dielectric material 216 formed on the dielectric material 210, the support material 204 formed on the dielectric material 216, and the dielectric material 214 formed on the support material 204. The material stack can be patterned and etched to form a number of openings in the material stack. The openings can be formed in materials 214, 204, 216, 210, and 212 and stop on the cell contacts 208. Capacitor elements can be formed by forming a metal, such as titanium nitride (TiN), for example, in the openings in the material stack. The capacitor elements 206 can be containers, which include openings in the capacitor elements, as illustrated in FIGS. 2B and 2C. Capacitor elements 206 that are containers have interior and exterior surface area allowing the capacitor elements to have increased capacitance when compared to a capacitor with the same exterior dimensions, but without interior surface area such as a stud. In a number of embodiments, the capacitor elements 206 can be studs, where metal completely fills the openings in the material stack.

In a number of embodiments, the support material 204 can be a nitride and dielectric materials 214 and 216 can be polysilicon. When the dielectric materials 214 and 216 are polysilicon, the material stack can include dielectric material 210, which can be an oxide, to act as an etch stop material during the etch process that removes dielectric material 216. In a number of embodiments the support material 204 can be a nitride and dielectric materials 214 and 216 can be an oxide. When the dielectric materials 214 and 216 are an oxide, the material stack may not include dielectric material 210 and the dielectric material 212 can act as the etch stop material during the etch process that removes dielectric material 216. In a number of embodiments the support material 204 can be an oxide and dielectric materials 214 and 216 can be polysilicon. When the dielectric materials 214 and 216 are polysilicon, the material stack can include dielectric material 210, which can be an oxide, to act as an etch stop material during the etch process that removes dielectric material 216. In a number of embodiments the support material 204 can be a nitride and dielectric materials 214 and 216 can be an oxide.

Figure 3A:
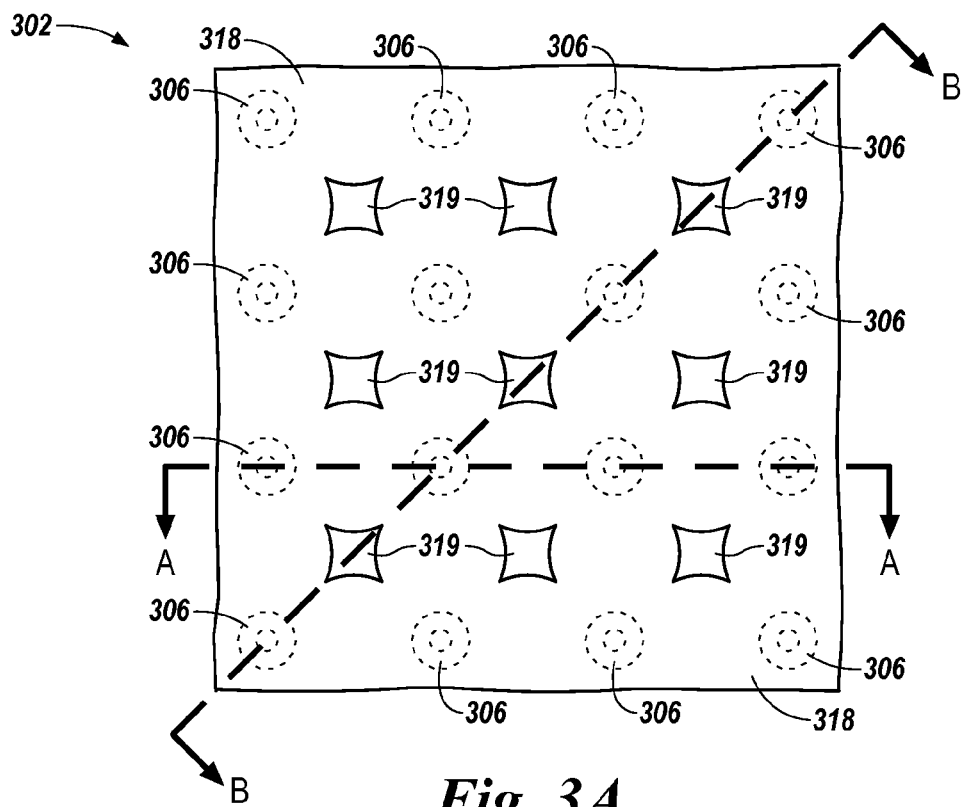
FIGS. 3A-3C illustrate various process stages subsequent to those shown in FIGS. 2A-2C associated with forming a support lattice in accordance with a number of embodiments of the present disclosure.
Figure 3B:
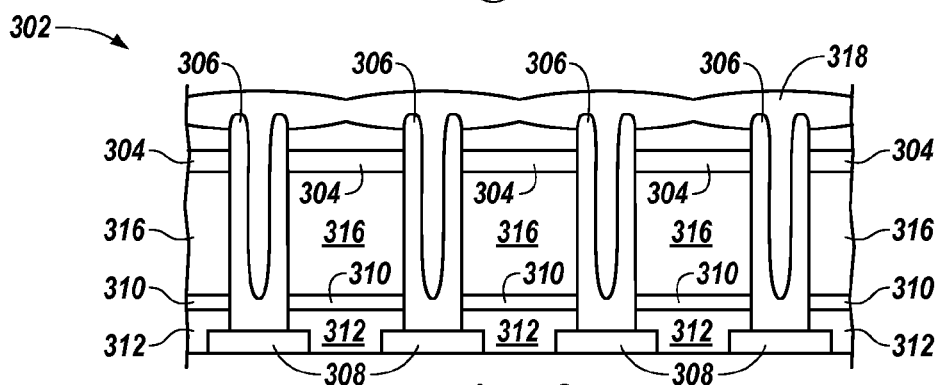
Figure 3C:
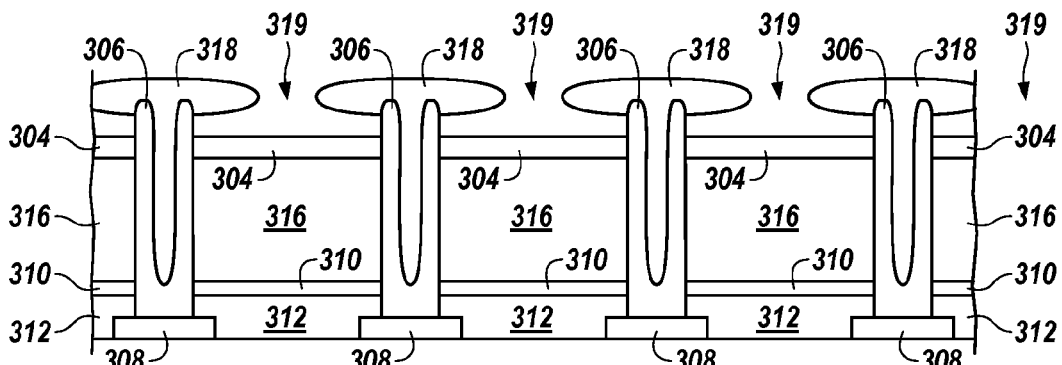

FIGS. 3A-3C illustrate various process stages subsequent to those shown in FIGS. 2A-2C associated with forming a support lattice in accordance with a number of embodiments of the present disclosure. FIG. 3A illustrates a top view of a portion of an array of memory cells in accordance with a number of embodiments of the present disclosure. FIG. 3B illustrates a cross-sectional view of a portion of an array of memory cells along the A-A cut line in accordance with a number of embodiments of the present disclosure. FIG. 3C illustrates a cross-sectional view of a portion of an array of memory cells along the B-B cut line in accordance with a number of embodiments of the present disclosure.

FIG. 3A illustrates a mask, e.g., carbon 318, formed on the upper portion of the capacitor elements (illustrated by the dotted lines). In one or more embodiments, the mask can include an oxide, a nitride, and/or polysilicon, among other materials. The carbon 318 formed on the capacitor elements include a number of openings 319. The openings 319 are formed on the diagonal between capacitor elements, while the carbon 318 is continuous horizontally and vertically along the rows and columns of capacitor elements.

FIG. 3B illustrates capacitor elements 306 formed in a material stack that includes a dielectric material 312, a dielectric material 310, a dielectric material 316, and a support material 304. In a number of embodiments, a dielectric material, such as dielectric material 214 in FIGS. 2A-2C, is removed via an etch process. The removal of the dielectric material 214 in FIGS. 2A-2C can allow the upper portion of the capacitor elements 306 above support material 304 to be exposed.

As illustrated in FIGS. 3A-3C, carbon 318 can be formed, after removal of dielectric material 214 illustrated in FIGS. 2A-2C, on the exposed upper portions of capacitor elements 306 using a low-step coverage process, such as physical vapor deposition (PVD), chemical vapor deposition (CVD), or plasma enhanced chemical vapor deposition (PECVD), among other techniques. A low-step coverage process can allow for the carbon to form on the capacitor elements 306 and continue to form until the carbon from adjacent horizontal and vertical capacitor elements 306 touches each other, leaving openings 319 in the carbon 318 diagonally between the capacitor elements 306. The openings 319, illustrated in FIGS. 3A and 3C, are self-aligned openings on the diagonal between the capacitor elements 306.

Figure 4A:
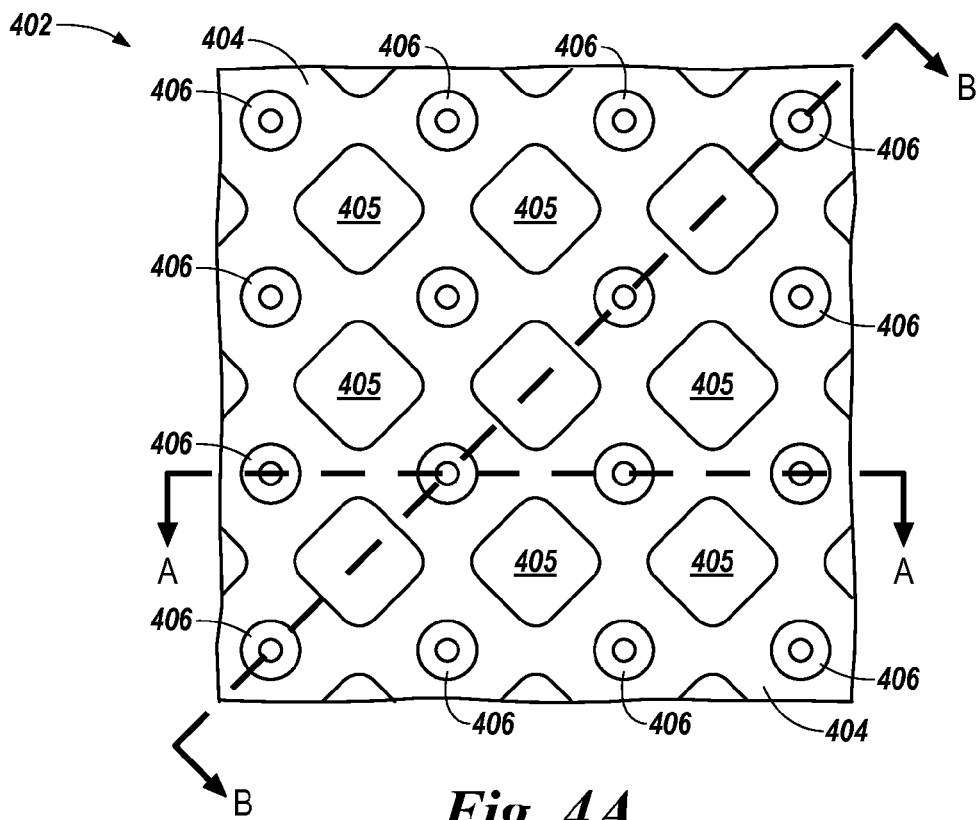
FIGS. 4A-4C illustrate various process stages subsequent to those shown in FIGS. 3A-3C associated with forming a support lattice in accordance with a number of embodiments of the present disclosure.
Figure 4B:
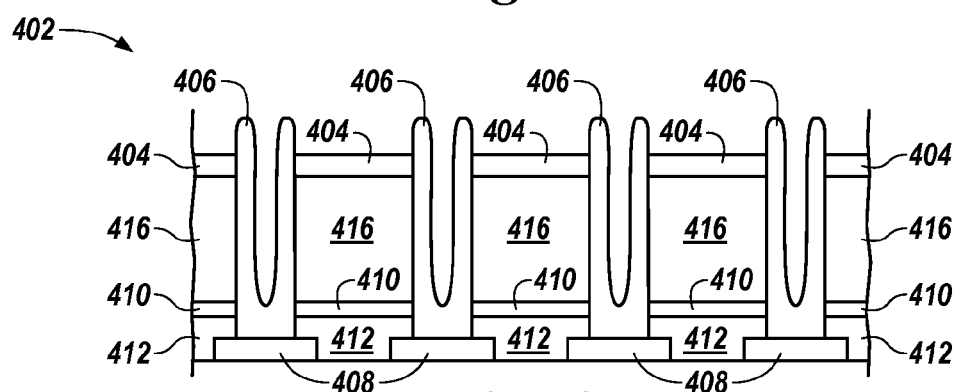
Figure 4C:
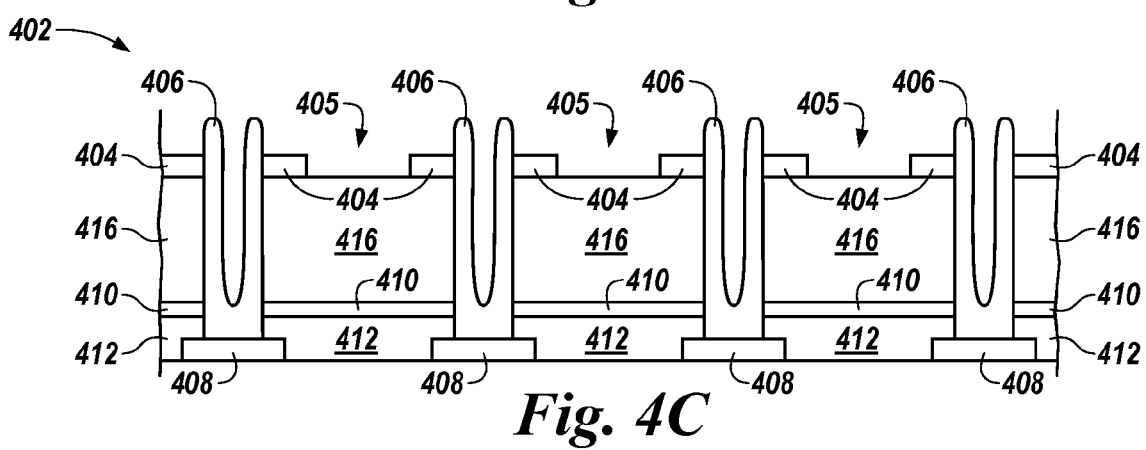

FIGS. 4A-4C illustrate various process stages subsequent to those shown in FIGS. 3A-3C associated with forming a support lattice in accordance with a number of embodiments of the present disclosure. FIG. 4A illustrates a top view of a portion of an array of memory cells in accordance with a number of embodiments of the present disclosure. FIG. 4B illustrates a cross-sectional view of a portion of an array of memory cells along the A-A cut line in accordance with a number of embodiments of the present disclosure. FIG. 4C illustrates a cross-sectional view of a portion of an array of memory cells along the B-B cut line in accordance with a number of embodiments of the present disclosure.

FIG. 4A illustrates support lattice 404 formed in the array of memory cells. The support lattice 404 includes a number of openings 405. The openings 405 can be formed by a dry etch process that removes a portion of the carbon and a portion of the support material 404. The dry etch process removes a portion of the support material 404 to form the support lattice 404. The dry etch process can include using difluoromethane/tetrafluoromethane ($CH_2F_2/CF_4$), among other etch chemistries. The dry etch process can allow portions of carbon 418 that are on portions of an array of memory cells that do not include capacitor elements to remain. The portions of carbon 418 can remain on portions of an array of memory cells that do not include capacitor elements 406 to protect those portions.

FIG. 4B illustrates capacitor elements 406 coupled to cell contacts 408 and formed in a dielectric material 412 and a dielectric material 410. As illustrated in FIG. 4B, the dry etch process removes the carbon, but does not remove the support material horizontally and vertically between the rows and columns of capacitor elements 406. The support lattice 406 being continuous horizontally and vertically between the rows and columns of capacitor elements 406 provides support to the capacitor elements 406 to limit lateral movement of the capacitor elements 406. The support lattice 406 is continuous between horizontally adjacent capacitor elements and vertically adjacent capacitor elements.

As illustrated in FIG. 4C, the dry etch process removes the carbon, and portions of the support material diagonally between the capacitor elements 406. The support lattice 406 being non-contiguous diagonally between capacitor elements 406 provides openings 405 in the support lattice 404. The openings 405 in the support lattice 404 provide access to the array of memory cells below the support lattice 404.

In a number of embodiments, once the support lattice 404 is formed by removing portion of the support material to form openings 405, subsequent process steps can be performed to form the memory array illustrated in FIGS. 1A-1C. The openings 405 in the support lattice can provide access to dielectric material 416. The dielectric material 416 can be removed via an etch process that introduces the etch chemistry to the dielectric material 416 through openings 405. The dielectric material 416 can be removed to isolate the capacitor elements 406 from each other, as illustrated in FIGS. 1B and 1C. In a number of embodiments, a dielectric material can be formed on the capacitor elements. The dielectric material can be formed on the exposed surface of the capacitor elements, which includes the interior surface of the capacitor elements and the exterior surface of the capacitor elements. The dielectric material that is formed on the portion of the exterior surface of the capacitor elements below the support lattice can access the capacitor elements through the openings in the support lattice, such as openings 105 in FIGS. 1A-1C. In a number of embodiments, a top electrode can be formed on each of the capacitor elements.

In a number of embodiments, the material stack can include a number of support materials formed between a number of dielectric materials. The process steps described in association with FIGS. 2A-2C, 3A-3C, and 4A-4C can be repeated a number of times to form a number of support lattices that surround capacitor elements in a memory cell array. In a number of embodiments, it can be beneficial to form a number of support lattices that surround capacitor elements in a memory cell array based on the height of the capacitor elements in the memory cell array.

Figure 5:
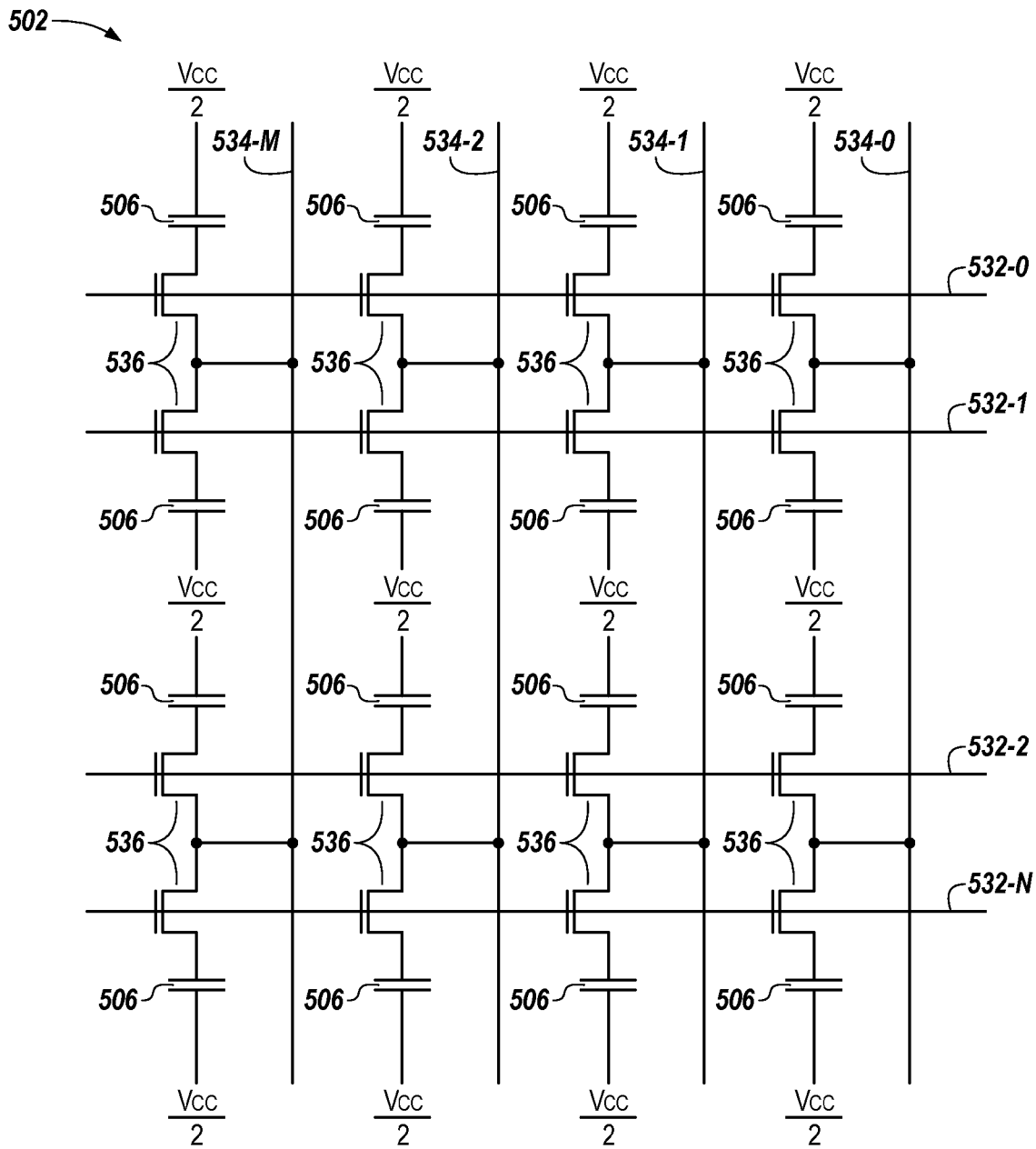
FIG. 5 is a schematic diagram of a portion of an array of memory cells in accordance with a number of embodiments of the present disclosure.

FIG. 5 is a schematic diagram of a portion of an array of memory cells in accordance with a number of embodiments of the present disclosure. The memory cells in the array illustrated in FIG. 5 can be DRAM memory cells. The memory cells include a capacitor 506 and an access device 536. The capacitor elements illustrated in FIGS. 1B and 1C can be the capacitors 506 of the memory cells in FIG. 5, for example. The DRAM memory cells can include data lines and access lines connected to each memory cell in the memory array. FIG. 5 shows a DRAM memory array 502 including data lines, 534-0, . . . , 534-M, and access lines, 532-0, . . . , 532-N, connected to each memory cell in the memory array. A DRAM memory array consists of a series of memory cells connected at contact points to access lines and data lines. The data lines, 534-0, . . . , 534-M, in FIG. 5, connect to the memory cells in the memory array. The memory array 502 in FIG. 5 is created by tiling a selected quantity of memory cells together such that memory cells along a given data line do not share a common access line and such that memory cells along a common access line do not share a common data line. The memory cell access device, e.g., transistors 536, includes a gate terminal that connects to an access line 532-0, . . . , 532-N. The access line, which connects to a multitude of memory cells, consists of an extended segment of the same material used to form the transistor's gate. The access line is physically orthogonal to the data line.

The data lines 534-0, . . . , 534-M consist of a conductive line connected to a memory cell's transistors 536. Due to the large number of attached memory cells, physical length of given data line, and the data line's proximity to other features, the data line can be susceptible to large capacitive coupling. For instance, a typical value for data line capacitance on a 350 nanometer (nm) scale fabrication process might be around 300 femtofarads (fF).

The DRAM memory cells shown in FIG. 5 consists of a transistor 536 and a capacitor 506, referred to as a one-transistor one-capacitor (1T1C) cell. The access lines 532-0, . . . , 532-N are connected to the gates of the transistor 536 and the data lines 534-0, . . . , 534-M are connected to the source/drain side of the transistors 536. The transistors 536 operate as a switch, between the capacitors 506 and the data lines 534-0, . . . , 534-M. The memory cells are capable of holding a single unit of binary information, as stored electric charge in the cell capacitor 506. Embodiments are not so limited to the example memory cells of FIG. 5. For example, in some embodiments, the memory cells can be a multilevel cell.

The access lines 532-0, . . . , 532-N, connected to the gates of the transistors 506, are used to activate the memory cells. The memory cells are addressed at an intersection of an access line and a data line. The state of the memory cells is then read by a sense amplifier (not shown) that determines through a data line the state of each memory cell. A potential is provided to a data line as part of a refresh operation to refresh the state read from the memory cell. A DRAM memory cell can be refreshed because the capacitors 506 in the memory cell array 502 can continuously lose their charge. A typical memory cell can be refreshed, for example, once every several nanoseconds.

As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a memory cell support lattice, the method comprising:
   forming a mask on and in contact with a number of capacitor elements in an array,
   the mask is in contact with an upper surface and a portion of a sidewall of the number of capacitor elements, and there is an opening between the mask and an upper surface of a support material surrounding the number of capacitor elements,
   and forming the mask on the number of capacitor elements includes forming the mask such that a space between vertically and horizontally adjacent capacitor elements is fully covered and a space between diagonally adjacent capacitor elements is partially covered;
   and forming a support lattice in the support material by etching the support material to remove portions of the support material below the openings in the mask, a space exists between an upper surface of the support material and a lower surface of the mask.

2. The method of claim 1, wherein the support material surrounds the number of capacitor elements in the array.

3. The method of claim 1, wherein the method includes etching the support material by introducing etch materials through the space in the mask between diagonally adjacent capacitor elements to form the support lattice.

4. The method of claim 1, wherein forming the mask on the number of capacitor elements includes depositing the mask using a physical vapor deposition (PVD) process.

5. The method of claim 1, wherein the method includes removing a polysilicon material below the support lattice by introducing an etch material through openings in the support lattice.

6. The method of claim 1, wherein the method includes removing an oxide material below the support lattice by introducing an etch material through openings in the support lattice.

7. The method of claim 1, wherein forming the support lattice includes forming a self-aligned support lattice.

8. A method of forming a support lattice for memory cells, the method comprising:
   forming a number of capacitor elements in a material stack, the material stack includes a support material, a first material below the support material, and a second material above the support material;
   removing the second material to expose portions of the number of capacitor elements above the support material and to expose an upper surface of the support material;
   forming carbon on and in contact with the number of capacitor elements, there is an opening between the upper surface of the support material and the carbon, and forming carbon on the number of capacitor elements includes forming carbon on an upper surface of the number of capacitor elements that is continuous horizontally and vertically between the number capacitor elements and includes openings diagonally between the number of capacitor elements;
   and forming a support lattice by etching the support material to remove portions of the support material below the openings in the carbon.

9. The method of claim 8, wherein the method includes removing the first material by introducing an etching material through the support lattice to isolate each of the number of electrode portions below the support lattice.

10. The method of claim 8, wherein the first material and the second material comprise polysilicon.

11. The method of claim 8, wherein the first material and the second material comprise an oxide.

12. The method of claim 8, wherein etching the support material to remove portions of the support material below the openings in the carbon includes a dry etch process to form the support lattice with self-aligned openings.

13. The method of claim 8, wherein the method includes forming a dielectric material on the number of capacitor elements and a number of top electrodes on the number of capacitor elements.

14. A method of forming memory cells in an array, the method comprising:
   forming a number of capacitor elements, wherein the number of capacitor elements are each coupled to an access device and the capacitor elements are formed in rectilinear rows and columns;
   forming carbon on and in contact with the number of capacitor elements, the carbon is in contact with an upper surface of the number of capacitor elements, and there is an opening between the carbon and an upper surface of a support material surrounding the number of capacitor elements, and forming carbon on the number of capacitor elements includes forming carbon that is continuous horizontally and vertically between the number capacitor elements and includes openings diagonally between the number of capacitor elements;

forming a support lattice that surrounds the number of capacitor elements and includes a number of self-aligned openings between the number of capacitor elements by etching the support material to remove portions of the support material below openings in the carbon on the number of capacitor elements;

forming a dielectric material on the number of capacitor elements; and forming a number of top electrodes on the number of capacitor elements.

15. The method of claim 14, wherein the number of openings comprise openings between diagonally adjacent capacitor elements.

16. The method of claim 14, wherein forming the support lattice includes removing a polysilicon material below a support material by introducing an etch material through the support lattice.

17. The method of claim 14, wherein the support lattice comprises a nitride material.

18. The method of claim 14, wherein the support lattice comprises an oxide material.

\* \* \* \* \*